(12) United States Patent
Valentin et al.

(10) Patent No.: US 8,755,030 B2
(45) Date of Patent: Jun. 17, 2014

(54) LITHOGRAPHIC APPARATUS AND DEVICE MANUFACTURING METHOD

(75) Inventors: Christiaan Louis Valentin, 's-Gravenzande (NL); Antonius Franciscus Johannes De Groot, Someren (NL); Robert-Han Munnig Schmidt, Hapert (NL); Johannes Petrus Martinus Bernardus Vermeulen, Helmond (NL); Bartholomeus Catharina Thomas Van Bree, Meijel (NL)

(73) Assignee: ASML Netherlands B.V., Veldhoven (NL)

( * ) Notice: Subject to any disclaimer, the term of this patent is extended or adjusted under 35 U.S.C. 154(b) by 383 days.

(21) Appl. No.: 13/044,242

(22) Filed: Mar. 9, 2011

(65) Prior Publication Data

US 2011/0222039 A1    Sep. 15, 2011

Related U.S. Application Data

(60) Provisional application No. 61/312,997, filed on Mar. 11, 2010, provisional application No. 61/333,368, filed on May 11, 2010.

(51) Int. Cl.
*G03B 27/52*  (2006.01)
*G03B 27/62*  (2006.01)
*G03F 7/20*   (2006.01)

(52) U.S. Cl.
CPC ........ *G03F 7/70783* (2013.01); *G03F 7/70266* (2013.01)
USPC ............... 355/55; 355/75; 355/76; 355/77

(58) Field of Classification Search
CPC ............ G03F 7/70783; G03F 7/70258; G03F 7/70266; G03F 7/707
USPC ................................ 355/55, 75–77
See application file for complete search history.

(56) References Cited

U.S. PATENT DOCUMENTS 5,657,130 A * 8/1997 Shirasu et al. ................. 356/401
6,151,122 A * 11/2000 Taniguchi et al. ............. 356/399
(Continued)

FOREIGN PATENT DOCUMENTS

JP    63-209126    8/1988
JP    2-297918    12/1990
(Continued)

OTHER PUBLICATIONS

Japanese Office Action mailed Aug. 16, 2012 in corresponding Japanese Patent Application No. 2011-047062.

(Continued)

*Primary Examiner* — Steven H Whitesell Gordon
(74) *Attorney, Agent, or Firm* — Pillsbury Winthrop Shaw Pittman LLP (57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate. An optical element of the projection system is adjustable. The lithographic apparatus includes a controller to control the adjustable optical element. The controller is arranged to drive the optical element so as to at least partly compensate for a magnification resulting from a bending of the patterning device.

18 Claims, 4 Drawing Sheets

(56) References Cited

U.S. PATENT DOCUMENTS

| | | | |
|---|---|---|---|
| 6,235,438 B1* | 5/2001 | Suzuki et al. | 430/30 |
| 6,258,492 B1* | 7/2001 | Miyachi | 430/5 |
| 6,262,792 B1* | 7/2001 | Higashiki | 355/52 |
| 7,019,816 B2* | 3/2006 | Ottens et al. | 355/72 |
| 7,221,434 B2* | 5/2007 | Shiode et al. | 355/75 |
| 7,307,698 B2* | 12/2007 | Miyajima et al. | 355/75 |
| 7,352,438 B2* | 4/2008 | Luttikhuis et al. | 355/53 |
| 2001/0026358 A1* | 10/2001 | Van Dijsseldonk | 355/75 |
| 2003/0016338 A1* | 1/2003 | Yasuda et al. | 355/55 |
| 2003/0081193 A1* | 5/2003 | White et al. | 355/72 |
| 2003/0197841 A1* | 10/2003 | Araki et al. | 355/50 |
| 2003/0210383 A1* | 11/2003 | Bjorklund et al. | 355/53 |
| 2004/0013956 A1* | 1/2004 | Sogard | 430/30 |
| 2005/0134829 A1 | 6/2005 | Ottens et al. | |
| 2006/0119816 A1* | 6/2006 | Baselmans et al. | 355/53 |
| 2006/0170902 A1* | 8/2006 | Won et al. | 355/75 |
| 2006/0279721 A1* | 12/2006 | Baggen et al. | 355/72 |
| 2007/0024831 A1* | 2/2007 | Hibbs et al. | 355/53 |
| 2007/0268476 A1* | 11/2007 | Phillips et al. | 355/75 |
| 2008/0013068 A1* | 1/2008 | Jeunink et al. | 355/75 |
| 2008/0291411 A1* | 11/2008 | Phillips | 355/52 |
| 2010/0073661 A1* | 3/2010 | Shibazaki et al. | 355/72 |
| 2010/0167189 A1* | 7/2010 | Del Puerto | 430/30 |

FOREIGN PATENT DOCUMENTS

| | | |
|---|---|---|
| JP | 5-326367 | 12/1993 |
| JP | 9-167736 | 6/1997 |
| JP | 2000-077321 | 3/2000 |
| JP | 2003-142373 | 5/2003 |
| JP | 2005-184016 | 7/2005 |
| JP | 2006-261418 | 9/2006 |
| JP | 2006-339438 | 12/2006 |
| JP | 2007-147941 | 6/2007 |
| JP | 2007-178819 | 7/2007 |
| JP | 2008-098325 | 4/2008 |
| JP | 2008-103410 | 5/2008 |
| JP | 2008-270491 | 11/2008 |
| WO | 2009/125867 A1 | 10/2009 |

OTHER PUBLICATIONS

Japanese Office Action mailed Apr. 16, 2013 in corresponding Japanese Patent Application No. 2011-047062.

* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/312,997, entitled "Lithographic Apparatus and Device Manufacturing Method", filed on Mar. 11, 2010 and U.S. Provisional Patent Application No. 61/333,368, entitled "Lithographic Apparatus and Device Manufacturing Method", filed on May 11, 2010. The contents of these applications are incorporated herein in their entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project a pattern onto the substrate at a high resolution, a high degree of focus of the projection of the pattern onto the substrate is desired.

SUMMARY

It is desirable to provide a lithographic apparatus able to project the pattern onto the substrate at a high degree of focus.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein an optical element of the projection system is adjustable, the lithographic apparatus further including an actuator to exert a torque or force on the patterning device, and a controller, the controller being connected to the actuator and to the adjustable optical element, the controller being arranged to drive the actuator to exert the torque or force on the patterning device, and drive the adjustable optical element in accordance with a bending of the patterning device, wherein the controller is arranged to drive the adjustable optical element to at least partly compensate for a magnification resulting from the bending of the patterning device.

According to an embodiment of the invention, there is provided a device manufacturing method including projecting a patterned beam of radiation onto a substrate, the method including: patterning a beam of radiation by a patterning device to form the patterned radiation beam; projecting the patterned radiation beam onto a target portion of the substrate by a projection system; exerting a torque or force on the patterning device by an actuator, and adjusting an optical element of the projection system in accordance with a bending of the patterning device, wherein the adjusting the optical element of the projection system compensates at least partly for a magnification resulting from a bending of the patterning device.

According to an embodiment of the invention, there is provided a lithographic apparatus including a support constructed to support a patterning device, the patterning device being capable of imparting a radiation beam with a pattern in its cross-section to form a patterned radiation beam; a substrate table constructed to hold a substrate; a projection system configured to project the patterned radiation beam onto a target portion of the substrate, an actuator configured to exert a torque or force on the patterning device, and a controller, the controller being connected to the actuator, the controller being arranged to determine a field curvature error of the projection system; and drive the actuator to exert a torque or force on the patterning device so as to at least partly compensate for the determined field curvature error.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
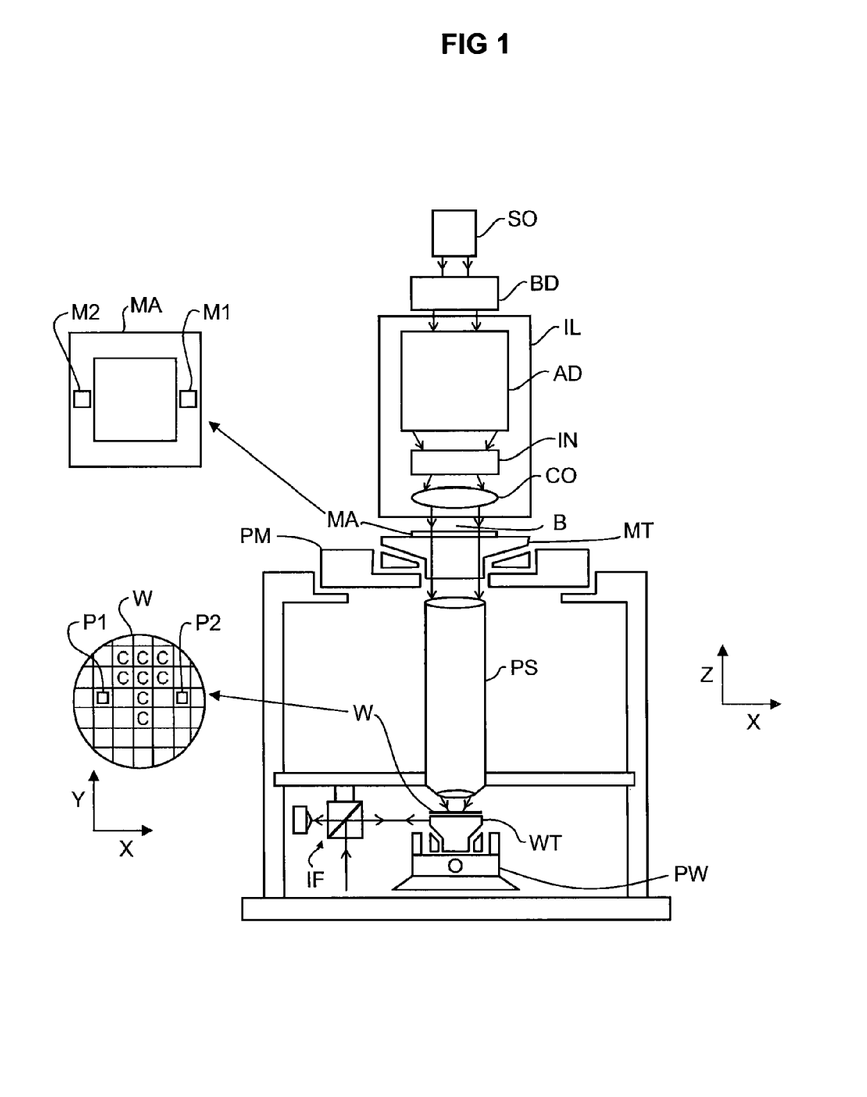
FIG. 1 depicts a lithographic apparatus in which an embodiment of the invention may be applied.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a lithographic apparatus of the state of the art, a leveling measurement may be performed prior to the projection of the pattern. From the leveling measurement, a height measurement of a surface of the substrate, levelling setpoints are derived using a least squares algorithm. The leveling map is applied to determine a local height and tilt of the substrate at the location where the projection takes place at that moment in time, so as to position the substrate in focus. The inventors have devised that a further improvement in focus may be achieved by bending of the patterning device by applying a bending moment to the patterning device. The applied bending moment may result in a curvature correction at the projection location in addition to the local height and tilt correction, thereby possibly achieving a better matching between the local curvature of the substrate and a projection, the projection of the pattern thereby at least partly following a curvature or local curvature of the substrate. As a result, improved focus may be achieved, thereby allowing to achieve a high resolution, hence a small line width. The bending of the patterning device may however result in scaling errors of the pattern onto the substrate, which may contribute to error budgets. The inventors have devised that an adjustment of the projection system, in an embodiment an optical element thereof, may be applied to at least partly compensate for a scaling error caused by a bending of the patterning device. Commonly, the pattern is provided on one side of the patterning device. Therefore, a bending of the patterning device may result in a magnification change (increasing or reducing) of the size of the pattern. This magnification change may result in a scaling error of the projection of the pattern onto the substrate. In order to at least partly compensate the scaling error, an adjustable optical element may be provided, adjustment of which having effect on a projection of the pattern onto the substrate, e.g having effect on a magnification factor of the projection system. The adjustable optical element may e.g. include an optical element having an adjustable position, e.g. a lens, slit, grating or mirror of which a position is adjustable. Other embodiment may include a deformable optical element (lens, slit, grating, mirror, etc), e.g. deformable by an actuator such as a piezo actuator. The term adjustable optical element is hence to be understood as an optical element of which an optical property (e.g. a focus distance, focus point, focus plane, lens power, transmission coefficient, reflection coefficient, direction, position in respect of an optical path, position in respect of one or more other optical elements, curvature, or any other property) is adjustable, such as by a change of a property of the optical element itself, by a change in the positioning thereof, etc. Adjustment of the adjustable optical element may result in a change in an optical magnification factor of the projection system which may at least partly compensate for the magnification change introduced by the bending of the patterning device.

Figure 2:
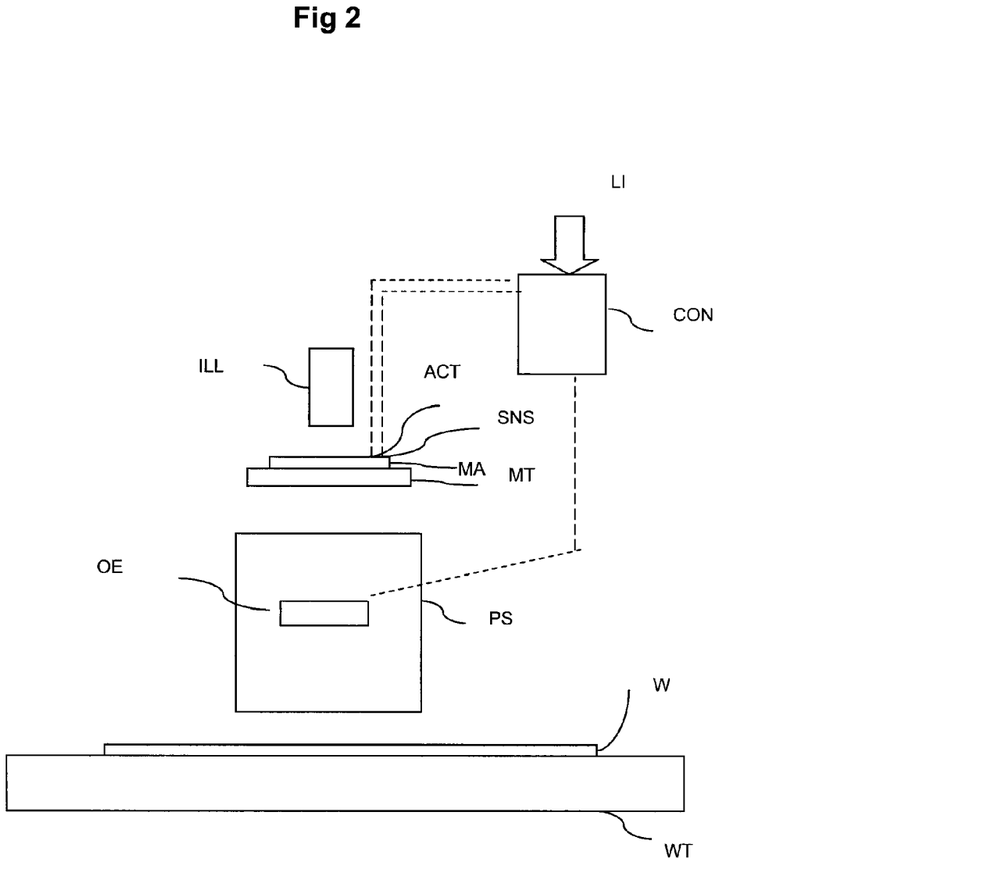
FIG. 2 depicts a lithographic apparatus part according to an embodiment of the invention.

FIG. 2 depicts a configuration to illustrate the above: a beam is projected by illuminator IL onto a patterning device MA held by a patterning device support MT. The patterned beam is projected onto the substrate W by passing through the projection system PS. The substrate W is held by substrate table WT. An actuator ACT is provided which may exert a torque or force on the patterning device, thereby resulting in a bending thereof. The projection system includes an adjustable optical element (examples of which have been mentioned above) so as to adjust a magnification of the projection system. The actuator ACT and the adjustable optical element OE are controllable by a controller CON, for example a suitably programmed microprocessor, microcontroller, or any other suitable analogue and/or digital control device. The control device is provided with leveling information (e.g. a leveling map), such as obtained from leveling measurement. The controller CON may determine a local height, tilt and/or substrate curvature from the leveling map, derive a desired bending moment of the patterning device there from and drive the actuator ACT accordingly. The adjustable optical element may be driven to at least partly compensate for the pattern deformation resulting from bending moment application to the patterning device as described above. The bending may be measured by a sensor SNS, a sensor output signal being provided to the controller CON, thereby allowing the controller to take account of a measured bending and drive the actuator ACT and/or the adjustable optical element accordingly. The sensor may include a strain gauge or another sensor type such as optical, capacitive, inductive, etc. Alternatively or in addition thereto, the sensor may include an aerial image sensor arranged to identify an aerial image characteristic during a scanning by the lithographic apparatus. In another embodiment, the sensor may include an existing TIS (transmission image sensor) of the lithographic apparatus which may be applied in the calibration of the lithographic apparatus.

Any suitable actuator may be applied to achieve a bending of the patterning device, such as an actuator which acts on the support to bend the support (thereby achieving a bending of the patterning device also), an actuator which acts on a (vertical) side face or horizontal face of the patterning device, such as a piezo actuator, pneumatic actuator, electromagnetic actuator, etc, a clamp which introduces a torque and/or force e.g. by a piezo element and/or a pneumatic element, etc.

The bending of the patterning device may be provided in two ways: a desired bending may be determined before scanning of a part of the substrate, such as a die. The desired bending may then be provided by the actuator and kept substantially constant during the scanning of that part of the substrate. Furthermore, instead of or in addition to such a static bending, a dynamic bending may be provided wherein the actuator is driven during the scanning so as to adapt the bending of the patterning device to the local curvature during a scan. Thereby, a more accurate following of the local curvature, and hence an improved focus may be achieved which may be beneficial when the surface of the substrate exhibits changes and/or irregularities which change during a scan. In an embodiment, a scanning velocity is adjusted in accordance with the (static or dynamic) bending of the patterning device.

As an example, the below described method may be applied for field curvature correction: A substrate topology measurement is performed, using e.g. a leveling sensor of the lithographic apparatus. The resulting substrate topology data is provided to a leveling algorithm, which determines therefrom substrate stage set points (e.g including substrate stage tilting) for the substrate stage position and curvature values for the patterning device (e.g. mask or reticle) curvature. Substrate stage command signals are derived from the substrate stage set points and substrate stage velocity data, making use of a substrate stage model. The substrate stage (i.e. substrate table) is driven in accordance with the substrate stage command signals. A patterning device bending model is applied to determine from the curvature values: patterning device bending command signals, pattern distortion data, and patterning device stage set points. The patterning device bending actuators are driven in accordance with the patterning device bending command signals. Patterning device stage command signals are determined from the patterning device stage setpoints using a patterning device stage model. Patterning device stage actuators are driven in accordance with the patterning device stage command signals. Optical element command signals are determined from the pattern distortion data using a projection system model. The adjustable optical element (e.g. an actuator thereof) is driven in accordance with the optical element command signals.

A configuration such as described with reference to FIG. 2 may be applied to at least partly compensate an effect of field curvature error in the projection system as a result of lens heating, by subjecting the patterning device to a suitable bending. During exposure by the lithographic apparatus, lenses of the projection system will exhibit thermal effects as a result of for example some absorption of the projected radiation beam. A temperature rise of one or more of the projection lenses of the projection system, or parts thereof, may give rise to deformations, which may result in errors such as the stated field curvature error. Information about lens heating may be obtained in several ways. For example, a temperature of the projection system or a temperature of a specific lens of lens part may be measured using any suitable temperature measurement. Alternatively, or in addition thereto, a measurement may be performed using an optical calibration, such as a calibration via the projection lens, for example using a so called ILIAS sensor, TIS (Transmission Image Sensor) sensor or any other alignment sensor.

As an example, at least one measurement may be performed using the alignment sensor, a field curvature error may then be calculated from the at least one measurement by the controller CON, for example by calculating a field curvature from the at least one measurement and comparing the calculated field curvature with a nominal or previously determined field curvature. The controller CON may then calculate a desired patterning device bending in order to at least partly compensate for the field curvature error and drive the actuator ACT accordingly.

As another example, at least one measurement may be performed using the temperature sensor, a field curvature error may then be calculated from the at least one temperature measurement by the controller CON, for example by calculating a field curvature from the at least one measurement and comparing the calculated field curvature with a nominal or previously determined field curvature. The controller CON may then calculate a desired patterning device (reticle) bending in order to at least partly compensate for the field curvature error and drive the actuator ACT accordingly.

In general terms, the above concept may be described as the controller of the lithographic apparatus being arranged to determine a field curvature error of the projection system; and drive the actuator to exert a torque or force on the patterning device so as to at least partly compensate for the determined field curvature error. Any suitable actuator to exert a force or torque on the patterning device may be applied, such as the ones described herein.

An embodiment of an actuator that may achieve a high bandwidth, hence enabling the dynamic bending, will be described below with reference to FIGS. 3 and 4. It will be understood that the actuator as described below may also be used in the static bending.

Figure 3:
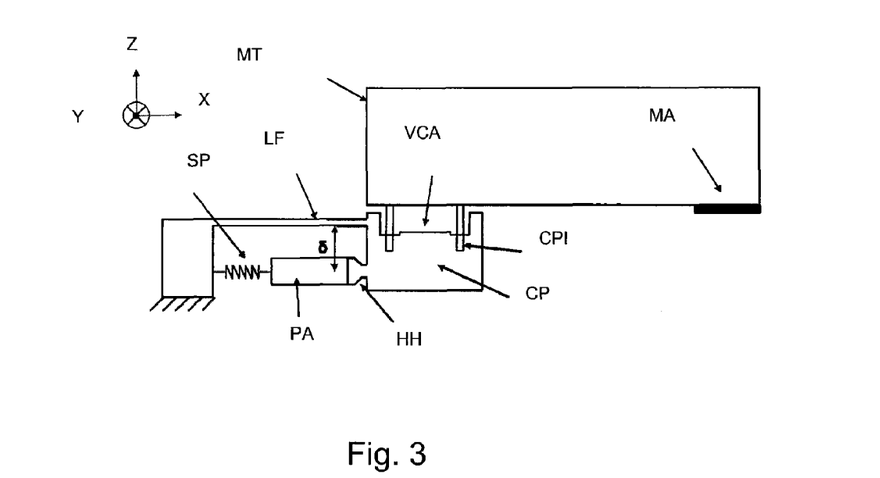
FIG. 3 depicts a side view of the lithographic apparatus part according to FIG. 2 according to an embodiment of the invention.

FIG. 3 depicts an actuator ACT which is attached to a side of the patterning device support MT, only part of which is depicted in FIG. 3. The actuator contacts the patterning device, only part of which is depicted in FIG. 3, using a contacting part CP, the contacting part CP being held by a parallel connection of a spring, namely in this example leaf spring LF, and an actuator element, in this example a piezo actuator PA. In series with the piezo actuator PA, a compliance, such as a spring SP is provided. The leaf spring LF in combination with the compliance allows the contacting part CP to contact the patterning device substantially with limited net force on the patterning device in vertical direction and rotational direction, therefore preventing undesired deformations thereof. To this end, the actuator element may be connected to the contacting part CP using a hole hinge HH. A strain gauge may be provided as a sensor on the piezo actuator element so as to measure a strain information representative of the actuator elongation and/or a bending of the patterning device. The contacting part may be provided with a vacuum clamping area VCA, for example a leaking (non contact) vacuum seal, so as to establish a contact executing a substantial force on the patterning device. Therefore, patterning device may be contacted by two contacting pins CPI, having a high stiffness in axial direction of the pins, while being in lateral direction, the latter to preventing the transfer of undesired forces on the patterning device. Operating the actuator will provide a torque on the patterning device using the two contacting pins CPI. Depending on a polarity of operation of the actuator element, the torque may be positive or negative to allow a bending of the patterning device with either a positive or negative curvature.

Figure 4:
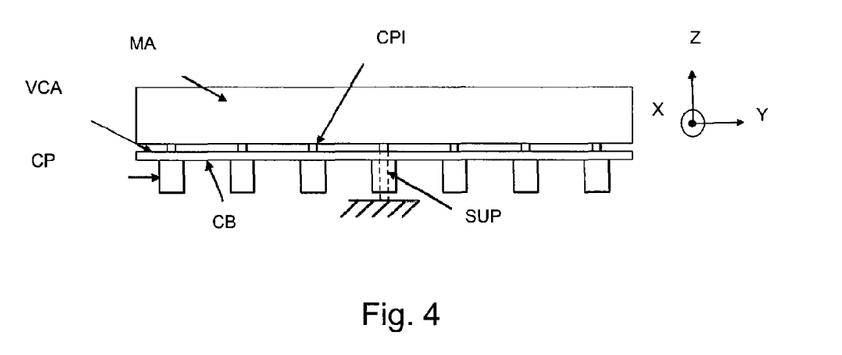
FIG. 4 depicts a side view of the lithographic apparatus part according to FIG. 2 according to an embodiment of the invention.

FIG. 4 depicts a schematic side view of the patterning device, actuators and part of the support. The patterning device MA is held by three point suspension including 3 support pins SUP on which the patterning device rests in vertical (z) direction so as to prevent the support from providing any deformation forces on the patterning device. Patterning device pushers or other devices may be provided to assist in accelerating and decelerating the patterning device, thereby substantially preventing a slip of the patterning device with respect to the support. Seen in a scanning direction, two rows of actuators are provided at opposite sides of the patterning device, one of which is depicted in FIG. 4. In practical embodiments, at least 5, and in an embodiment at least 10 actuators are arranged on each of the sides to provide for a uniform bending of the patterning device. The contacting parts CP of the actuators in row may be interconnected by a connection body CB which may be flexible and/or thin, so as to minimize added stiffness in vertical direction which may be required from multi machine overlay point of view.

A main benefit of an embodiment of the invention is the increased focus improvement and subsequently yield with respect to interdie curvature correction.

It is noted that the actuator as described with reference to FIGS. 3 and 4 may be but used in conjunction with the described controller and adjustable optical element so as to e.g. compensate for magnification effects, however may also be applied in other configurations, e.g. without the described controller and/or adjustable optical element.

The proposed concept may have one or more of the following benefits: A minimized addition of z- and Ry-stiffness to the patterning device to ensure similar gravitational deformation as the patterning device in the current state-of-art patterning device stage. This may subsequently limit Multi Machine Overlay.

Because the added stiffness to the patterning device may be minimized a near pure bending stress may be achieved in the patterning device. Because of the offset of the pattern with respect to the patterning device's neutral axis, a near pure magnification of the pattern may be obtained which can largely be corrected by the lens system. For intradie curvature correction it is probable that dynamic magnification correction may be required. When this magnification is counteracted by the projection system, active lens elements may be required during scanning motion.

A heat load on the patterning device by the use of piezoelectric actuation may reduced.

Decoupling of the bending actuator mass in x- and y-direction from the patterning device, limiting the pattern disturbance forces and subsequently patterning device pattern distortions during acceleration.

The inventors have realized that introducing the bending moments onto the patterning device (e.g. reticle) via the W-clamps as proposed previously may not be desired. This is because the bending of the photomask is achieved by the transmission of forces at the patterning device (e.g. reticle) and W-clamp interface in the x-direction. Consequently, the friction forces rotate from having a pure y-direction into components in both x- and y-direction. When the same clamp pressure is used, a lower friction force is available to propel the patterning device (e.g. reticle). The effects of patterning device (e.g. reticle) slip for the case of integrated benders in the W-clamps therefore occur at lower stage accelerations than the case when no bending mechanism is implemented.

The majority of the proposed solutions apply a conventional vacuum clamp configurations to transfer acceleration forces from the patterning device (e.g. reticle) stage to the patterning device (e.g. reticle) using friction. Studies have shown that for high-throughput machines with reticle stage accelerations~150 m/s2 these W-clamps may become obsolete because: The friction coefficient is too low to transfer the acceleration forces to the patterning device (e.g. reticle) and subsequently macro slip occurs.

During the acceleration phase, micro-slip occurs between the W-clamp mass and patterning device (e.g. reticle) mass. The microslip leads to in-plane disturbance forces on the reticle which subsequently lead to in-plane pattern deformation. These deformations remain present during the scan phase and subsequently lead to overlay errors.

Taking the above into consideration, the inventors have realized that future systems can no longer rely on friction based clamping.

It is remarked that realization of patterning device (e.g. reticle) curvature or out-of-plane deformation as proposed in WO2009/125867A1 is not desired because: The method deforms the patterning device (e.g. reticle) stage. As a result these stage deformations will have a negative influence on stage positioning accuracy.

The photomask will most likely not achieve the desired curvature in combination with the current clamp structure. This is because the patterning device (e.g. reticle) is not kinematically constrained in the patterning device (e.g. reticle) stage.

The direct coupling of the W-clamp to the patterning device (e.g. reticle) in combination with a bending mechanism may also not be desired because it may result in a local patterning device (e.g. reticle) compression where the W-clamp is touching the photomask. The patterning device (e.g. reticle) will therefore not bend over its centerline and subsequently additional pattern distortions arise with resulting NCE.

Figure 5:
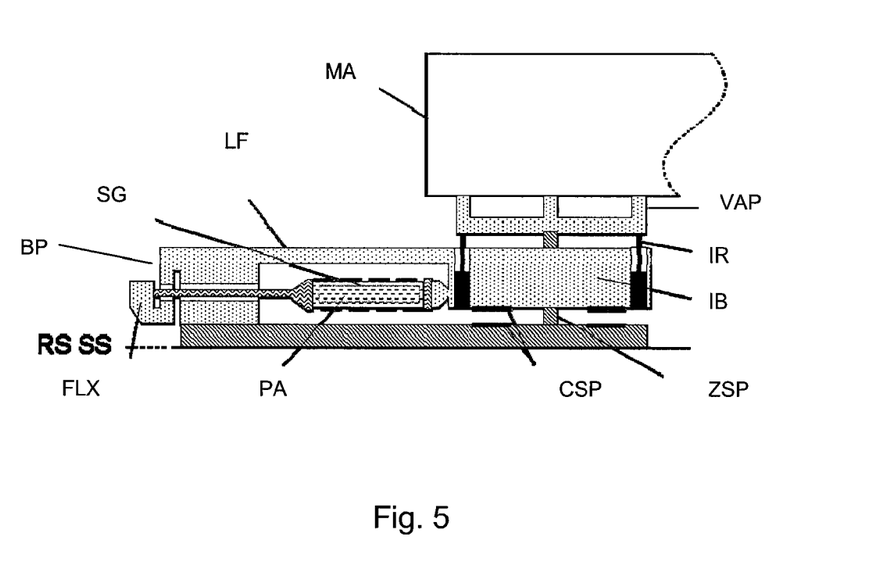
FIG. 5 depicts a part of a lithographic apparatus according to an embodiment of the invention.

According to an embodiment, a patterning device clamp that may apply the known W clamp is depicted in FIG. 5. The patterning device MA is held by a vacuum pad VAP which may be referred to as a W-clamp due to its W shaped structure that contacts the patterning device in a triple way and provides a vacuum clamping area. The vacuum pad is connected by a connection member, for example at a center of the vacuum pad, to an interface body IB. The assembly of interface body and W-clamp may also be referred to as a contacting part. The connection member provides for a rotational decoupling in Ry direction. Interface rods IR may be provided between ends of the vacuum clamp and the interface body, that may allow resilience, flexibility, or movability of the ends of the vacuum clamp in vertical direction. The interface body is connected using a parallel arrangement of a leaf spring LF (or more generally a spring) and an actuator, such as a piezo actuator (piezo element) or a mechanically preloaded piezo actuator, to a base part BP. The leaf spring may be a tuned leaf spring that allows an elongation in horizontal direction in the plane of drawing. The base part is connected to for example a reticle stage short stroke RS SS actuator. Flexibility member (i.e. resilience) FLX allows the actuator PA some degree of flexibility in the direction from interface bode IB to base part BP. The interface body is connected to the retice (patterning device) stage short stroke RS-SS using a support member ZSP that supports the interface body in vertical direction. Operation of the actuator PA will provide for an increase or decrease of its length, allowing the interface body and hence via the interface rods, the vacuum clamp, to tilt in the plane of drawing, causing a torque of the patterning device MA. An extension of the actuator PA may be measured by a strain gauge SG applied thereon. A rotation of the interface body with respect to the reticle (patterning device) stage short stroke may be measured by capacitive sensor plates CSP on interface body IB and reticle (patterning device) stage short stroke (i.e. support stage short stroke), allowing to determine a rotation of the vacuum clamp VAP and a bending of the patterning device there from. A symmetric setup may be provided by providing arrangements as depicted in FIG. 5 on two (or four) sides of the patterning device, so as to allow applying force and/or torque substantially symmetrically. Using the arrangement as described with reference to FIG. 5, a pusher may be omitted, hence relying on friction.

Most other known proposals use in-plane forces to realize the bending torques. Due to the large residual errors (NCE) inducing the torque with vertical forces instead of horizontal forces is desirable because: The sensitivity to force errors and subsequently pattern distortion errors is a factor 4 lower when applying forces in z-direction instead of in x, y-direction.

Semi-specifications show that photomasks are well defined at the pattern side instead of the other surfaces.

Other benefits of embodiments of the invention that can be thought of are: Potentially relaxed specifications with respect to wafer flatness. Because wafer cost is also influenced by wafer polishing techniques, wafer costs can be reduced.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate, wherein the projection system includes an optical element that is adjustable,
an actuator configured to exert a torque or force on the patterning device, and
a controller, the controller being connected to the actuator and to the adjustable optical element, the controller being arranged to
drive the actuator to exert a torque or force on the patterning device to apply a desired bending moment to the patterning device, the desired bending moment applied to at least partly compensate a field curvature error of the projection system and imparting a bending to the patterning device, and
drive the adjustable optical element in accordance with the bending of the patterning device resulting from the applied desired bending moment, wherein the controller is arranged to drive the adjustable optical element to at least partly compensate for a magnification resulting from the desired bending moment applied to the patterning device.

2. The lithographic apparatus of claim 1, comprising a sensor configured to measure a bending of the patterning device, a sensor output signal of the sensor being provided to the controller.

3. The lithographic apparatus of claim 1, wherein the controller is arranged to:
determine a desired bending of the patterning device from a height map of the substrate;
drive the actuator in correspondence with the desired bending;
drive the optical element so as to at least partly compensate for the magnification resulting from the bending of the patterning device.

4. The lithographic apparatus of claim 1, wherein the controller is arranged to:
derive a bending of the patterning device from the sensor output signal; and
drive the optical element in response to the derived bending of the patterning device, 5. The lithographic apparatus of claim 1, wherein the support comprises a three point suspension to support the patterning device.

6. The lithographic apparatus of claim 1, wherein the actuator is arranged between the support and the patterning device, the actuator comprising:
- a contacting part constructed to contact the patterning device,
- the contacting part being held by a parallel connection of a spring and an actuator element.

7. The lithographic apparatus of claim 6, wherein the spring comprises a leaf spring.

8. The lithographic apparatus of claim 6, wherein the actuator element comprises a series connection of a piezo element and a resilience.

9. The lithographic apparatus of claim 6, wherein the contacting part comprises a vacuum clamping area.

10. The lithographic apparatus of claim 6, wherein the contacting part comprises two contacting pins to contact the patterning device.

11. The lithographic apparatus of claim 1, wherein a plurality of actuators is arranged on opposite sides of the patterning device along a scanning direction.

12. A lithographic apparatus comprising:
- a support constructed to support a patterning device, the patterning device being capable of imparting a radiation beam with a pattern in its cross-section to form a patterned radiation beam;
- a substrate table constructed to hold a substrate;
- a projection system configured to project the patterned radiation beam onto a target portion of the substrate,
- an actuator configured to exert a torque or force on the patterning device, and
- a controller, the controller being connected to the actuator, the controller being arranged to
  - determine a field curvature error of the projection system; and
  - drive the actuator to exert a torque or force on the patterning device to apply a desired bending moment to the patterning device so as to at least partly compensate for the determined field curvature error, the desired bending moment imparting a bending to the patterning device.

13. The lithographic apparatus of claim 12, wherein the controller is arranged to determine the field curvature error from a temperature measurement of at least a part of the projection system.

14. The lithographic apparatus of claim 12, wherein the controller is arranged to determine the field curvature error from at least one alignment measurement.

15. A device manufacturing method comprising:
- patterning a beam of radiation by a patterning device to form a patterned radiation beam;
- projecting the patterned radiation beam onto a target portion of the substrate by a projection system;
- exerting a torque or force on the patterning device by an actuator to apply a desired bending moment to the patterning device, the desired bending moment applied to at least partly compensate a field curvature error of the projection system and imparting a bending to the patterning device, and
- adjusting an optical element of the projection system in accordance with the bending of the patterning device resulting from the applied desired bending moment, wherein the adjusting the optical element of the projection system compensates at least partly for a magnification resulting from the desired bending moment applied to of the patterning device.

16. The method of claim 15, wherein the bending of the patterning device is measured by a sensor.

17. The method of claim 15, further comprising:
- determining a desired bending of the patterning device from a height map of the substrate;
- driving the actuator in correspondence with the desired bending;
- driving the optical element so as to at least partly compensate for the magnification resulting from the bending of the patterning device.

18. The method of claim 15, further comprising:
- deriving a bending of the patterning device from a sensor output signal of the sensor; and
- driving the optical element in response to the derived bending of the patterning device.

* * * * *